United States Patent [19]

Barth

[11] Patent Number: 4,587,719
[45] Date of Patent: May 13, 1986

[54] METHOD OF FABRICATION OF LONG ARRAYS USING A SHORT SUBSTRATE

[75] Inventor: Phillip W. Barth, Palo Alto, Calif.

[73] Assignee: The Board of Trustees of the Leland Stanford Junior University, Stanford, Calif.

[21] Appl. No.: 617,304

[22] Filed: Jun. 5, 1984

Related U.S. Application Data

[63] Continuation-in-part of Ser. No. 518,931, Aug. 1, 1983.

[51] Int. Cl.[4] .............................................. H01L 21/90
[52] U.S. Cl. .................................... 29/577 C; 29/580; 29/583; 29/588; 29/591; 29/573; 357/49; 357/69; 357/72; 361/398; 374/178
[58] Field of Search ..................... 29/572, 573, 577 R, 29/577 C, 580, 581, 582, 583, 588, 591; 148/DIG. 28; 357/49, 69, 72; 361/398; 374/178

[56] References Cited

U.S. PATENT DOCUMENTS 3,466,741 9/1969 Wiesner ............................ 357/49 X
3,748,546 7/1973 Allison .............................. 357/49 X
4,072,982 2/1978 Stein ................................. 357/69 X

OTHER PUBLICATIONS

Monnier, M. et al, "An Original Interconnection Technique for an Electronic Payment Card" in *Electrocomponent SCI & Tech.*, 10(1), pp. 23-29, 1982.
Barth P. W. et al, "Thin Linear Thermometer Arrays . . . " in *IEEE Trans. on Electron Dev.*, ED-29 (1), pp. 144-150, 1-1982.
Shamma-Donoghue, S. A. et al, "Thin Film Multielectrode Arrays . . . " in *IEEE Trans. on Electron Dev.*, ED-29 (1), pp. 136-144, 1-1982.
Glaser, A. S. et al., *Integrated Circuit Engin.-Design, Fabrication, & Applic.*, pp. 409-420.

*Primary Examiner*—Donald L. Walton
*Assistant Examiner*—Alan E. Schiavelli
*Attorney, Agent, or Firm*—Flehr, Hohbach, Test, Albritton & Herbert

[57] ABSTRACT

A method of forming a flexible array of circuit elements and electrical contacts where parallel lines of conductors joined by short perpendicular line of conductors are folded both about an axis parallel to the perpendicular line of elements and about an axis parallel to parallel lines thereby forming a linear array.

15 Claims, 8 Drawing Figures

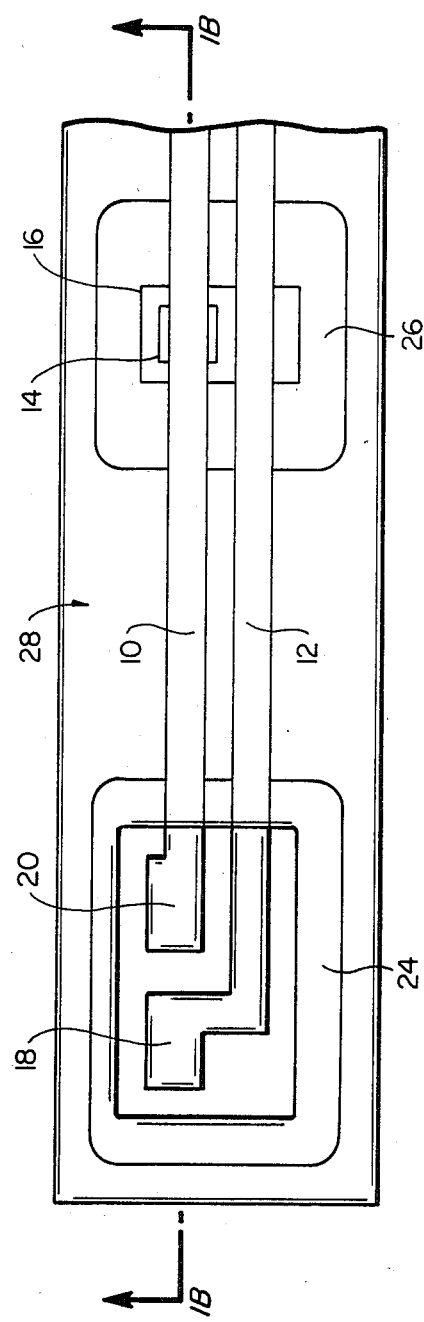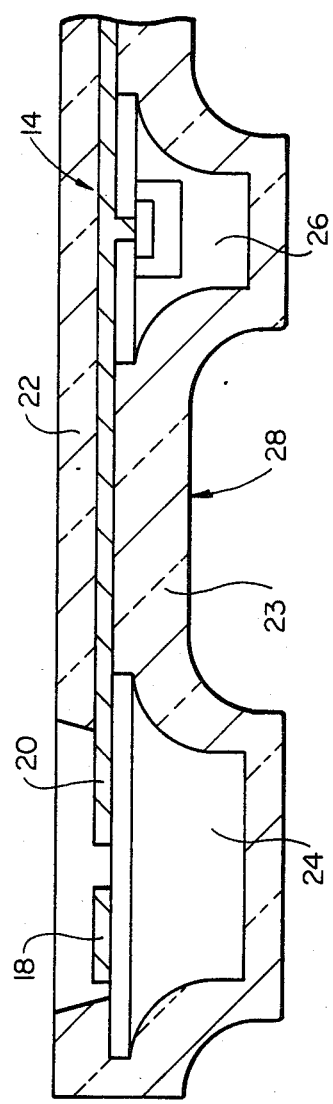
FIG_1A
FIG_1B

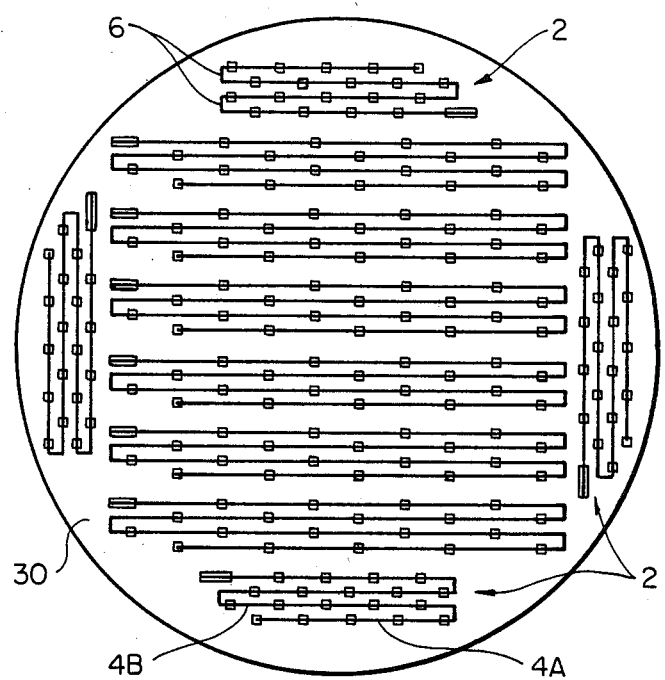
FIG_2
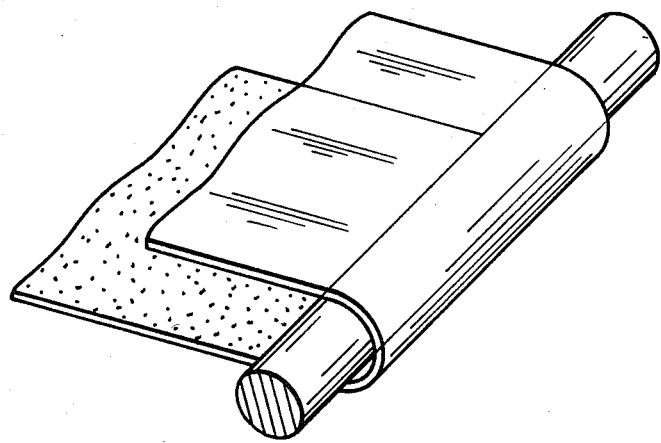
FIG_4

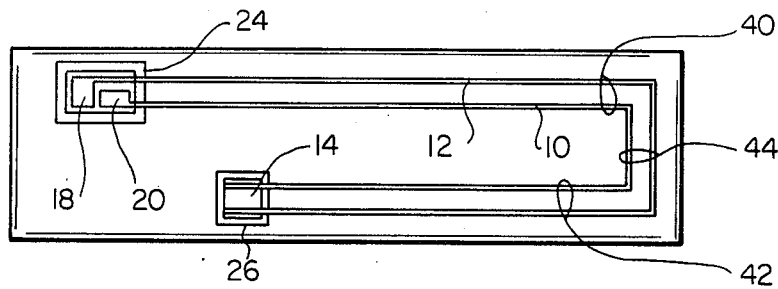
FIG_3A
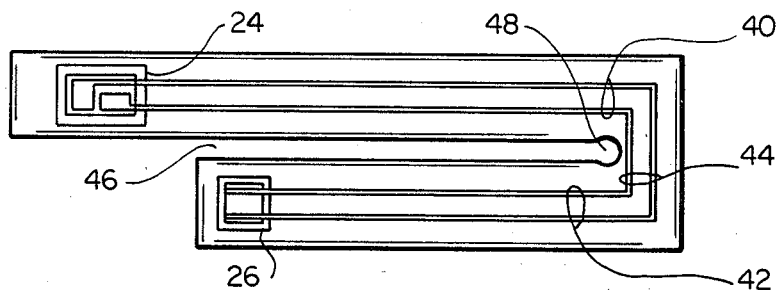
FIG_3B
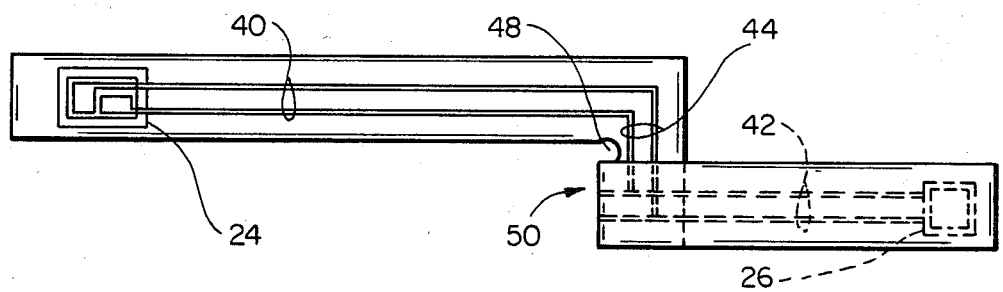
FIG_3C
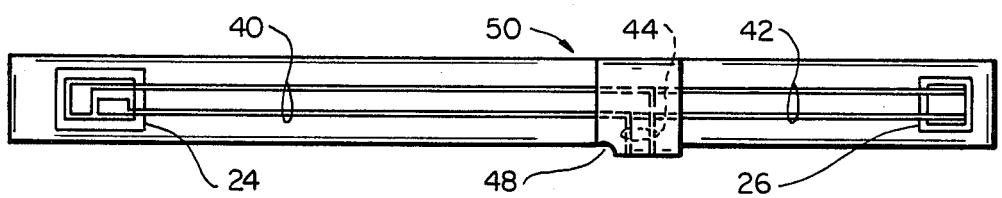
FIG_3D

METHOD OF FABRICATION OF LONG ARRAYS USING A SHORT SUBSTRATE

The present application is a continuation-in-part of a Phil Barth U.S. Application Ser. No. 518,931, filed Aug. 1, 1983, entitled Method of Fabricating Flexible Electronic Integrated Circuits and Resulting Structure; incorporated herein by reference.

This invention relates generally to integrated circuits, and more particularly the invention relates to a method of fabricating flexible integrated circuits and the resulting structures.

Monolithic integrated circuits are electronic circuits comprising a plurality of electronic elements interconnected on one single wafer of a semiconductor substrate such as silicon. Generally, monolithic circuits have in the past been limited to one rigid substrate.

Hybrid integrated circuits are electronic circuits comprising a plurality of semiconductor chips or devices which are mounted on a supporting substrate. Hybrid circuits using rigid ceramic substrates have been employed in high frequency applications for many years. Flexible hybrid circuits are known, also, in which finished semiconductor chips are mounted on a polymer membrane having conductive lead patterns for interconnection of the chips.

The present invention is directed to a monolithically fabricated flexible integrated circuit which is smaller than flexible hybrid integrated circuits heretofore known. A batch fabrication process for making the flexible integrated circuit results in high yields, low cost, and small size.

One application where the flexible integrated circuits have proved to be especially useful is in a linear thermometer array which is an improvement over the type disclosed by Barth and Angell in "Thin Linear Thermometer Arrays for Use in Localized Cancer Hyperthermia", *IEEE Transactions on Electron Devices*, Vol. ED-29, No. 1, pp. 144–150, January 1982.

Accordingly, an object of the present invention is a flexible integrated circuit.

Another object of the invention is an improved method of fabricating flexible circuits.

A further object of the invention is a method of economically batch fabricating flexible integrated circuits.

As the term is used herein, an "integrated circuit" comprises at least one electrical component and a conductive lead structure. In one embodiment of a flexible integrated circuit as incorporated in the long linear arrays in accordance with the invention, a first semiconductor body having a device structure and a second semiconductor body having an electrical contact are supported by a flexible medium with one or more flexible conductors electrically interconnecting the two semiconductor bodies.

In fabricating the integrated circuit, the component and contact are formed on or in a major surface of a semi-conductor substrate with electrical conductors formed on the surface of the substrate interconnecting the component and contact. A flexible material such as a polymer, for example, is then adherently applied to the surface. Thereafter, semiconductor material between the component and the contact is removed by selectively etching the opposite surface of the wafer using conventional masking and chemical etching, leaving exposed the conductor or conductors between the component and contact.

The conductor or conductors are then insulated by depositing a second layer of polymer on the surfaces exposed by etching. Then the individual array is cut out of the flexible substrate with a scalpel or scissors.

The technology has been used to fabricate linear arrays of silicon diodes, electrically interconnected by the thin wires, for use as thermometer array probes in cancer hyperthermia.

In this fabrication technology the polymer is a polyimide layer, formed by spin-coating a silicon wafer with a liquid precursor to the polyimide, then curing this precursor at a high temperature (350 degrees C.) to form the polyimide layer itself. Obviously, the maximum width of the polyimide layer can be no larger than the largest dimension of the silicon wafer.

The silicon wafer used is a thin disk, so the largest dimension is the diameter—two inches for wafers used to date for this technology. The longest thermometer array comprising a plurality of the integrated circuits described above which can be formed on the silicon wafer is thus also two inches. If it is desired to fabricate several identical arrays on the same wafer, then the length of each must be less than two inches, if known technology is utilized.

To date the thermometer arrays fabricated have been no more than 3.5 cm long. This length is too short for many biomedical applications, including many of the cancer hyperthermia cases for whcih this technology was first developed, and in which the array must be long enough to pass completely through the width of a large cancer tumor.

An object of the present invention is to provide a method of fabricating longer, flexible arrays.

The first method that comes to mind is to fabricate several arrays and somehow stick them together end-to-end. This has several problems, including more expense, less reliability, and bulkiness of the resulting assembly.

A second method is to form the thermometer array as a curved or meandered pattern on the silicon wafer, then to unwind or unfold the resulting non-linear array to approximate a linear array.

Not just any unfolding method will work well. If the array is formed as a spiral on the silicon wafer, it will be more susceptible to breakage when the ends are pulled than will a purely linear array. Such curved arrays tend to fold and kink under tension. In addition, spirals are wasteful of area on the silicon wafer and do not maximize the number of arrays that can be formed on the same wafer.

A further possibility is using a spiral with squared-off corners. This is more efficient in terms of use of wafer area, but it worsens the problem of kinking, which will now be sure to occur at the corners. In addition, because of the inward-spiraling shape the distance from corner to corner changes from the exterior to the interior of the spiral, making it difficult to lay out a regular array of diodes.

It is therefore an object of the present invention to provide a method which will be area-efficient and also produce an array as strong as a purely linear array. If a meandered pattern can be layed out, folded out flat and quasi-linear, so that the fold points are not very bulky, and if then the fold points can be strengthened with more polyimide used as a glue (or some other glue may be used), a practical optimum will be achieved.

Thus an objective of the present invention is to provide a meander pattern and a folding technique which will produce this optimum.

These and other objectives of the present invention are achieved by providing an array of semi-conductor elements suitable for a thermometer array or the like laid out in a meandered pattern. Each thermometer array pattern includes at least two parallel lines of conductors joined by a short perpendicular line of conductors. The array is cut out of the substrate in which it is first formed. The array is folded both about an axis parallel to the perpendicular line of elements, and about an axis parallel to both parallel lines, so that a linear array, ideal for use as a thermometer or the like, is formed.

The invention and objects and features thereof will be more readily apparent from the following detailed description and appended claims when taken with the drawings, in which:

FIGS. 1A and 1B are plan and cross-sectional views of a portion of a flexible integrated circuit array in accordance with one embodiment of the invention.

FIG. 2 is a schematic diagram of the layout of several arrays on a single substrate, FIG. 3 is a diagram of the folding method, FIG. 4 is a diagram of a method used to prevent breakage of wires at the point where a fold is made.

The invention will be described for a very simple embodiment consisting of one silicon island containing a diode, a second silicon island containing contact regions, and a flexible polymer region containing conductors and connecting the two islands. However, it will be appreciated that complex arrays containing additional islands, more complex circuitry, and more interconnecting conductors can be fabricated in accordance with this invention.

Referring now to the drawing, FIGS. 1A and 1B are views of one pair of semiconductor elements which, by being multiplied in linear fashion as shown in FIG. 2, form the active devices of the array of this invention. Its essential elements include conductive metal patterns 10, 12 interconnecting device contacts 14, 16 with external contacts 18, 20. Upper and lower layers 22, 23 of polyimide material cover the circuit except as etched to expose contacts 18, 20. Semiconductor silicon body 24 supports the contacts; the region 28 between these semiconductor bodies 24, 26 allows for flexing of the structure.

In manufacturing of a plurality of thermometers, each is laid out on a silicon substrate 30 as shown in FIG. 2. Each array 2 comprises at least two parallel lines of elements 4A, 4B connected by a perpendicular line 6. Typically the elements (which are shown as elements 24, 26 in FIG. 1) are laid out only on the parallel lines, not the perpendicular lines. The process steps outlined in the incorporated Barth application are used to form the elements 24, 26 and connecting metal lines. Briefly the steps include: providing a body of semiconductor material; forming plural circuit elements on the upper surface of said body; providing conductive interconnections on the same major surface to interconnect the circuit elements; attaching a flexible polymer layer to the conductive interconnections and first major surface; providing an opening or openings in the polymer layer to allow contact to said conductive interconnections; removing portions of the body of semiconductor material by etching, leaving separated islands of semiconductor material supported by said polymer layer; attaching an additional polymer layer over the second or bottom major surface of said islands and polymer, forming a layer of polymer which encases the islands and conductive interconnections. After cutting each linear array out of the substrate, each is folded to fashion a linear array.

A representative combination of a silicon island 24 with bonding pads 18, 20 connected to a silicon island 26 with a diode or other active device 14 appears in FIG. 3A. The metal interconnects 10, 12 which described two parallel pairs of lines with a perpendicular interconnect form a continuous, meandering path as appears in FIG. 3A. The meandering array is straightened to be linear by the process shown in FIG. 3B–3D.

FIG. 3B illustrates how material is removed between parallel regions of interconnections to allow folding and straightening. Since the material is thin, the cut material can be removed with a scalpel, scissors, or the like. As a part of this material-removal step, a substantially circular hole 48 is cut in the polymer at the end of the linear cut 46. This hole prevents tearing near what is to be the folded region.

To now straighten the meandering array, two folds are necessary at the region 50. The first fold, as shown in FIG. 3C, folds the polymer through an angle of approximately 180 degrees about an axis perpendicular to the parallel regions; the fold point is at or near the juncture of said perpendicular region 44 with one of said parallel regions 42.

The second fold, shown in FIG. 3D, comprises folding the polymer through an angle of approximately 180 degrees about an axis parallel to the parallel regions 40, 42. The fold point is at or near the juncture of perpendicular region 44 with the other adjacent parallel region 40.

Of course, the sequence of folds shown in FIGS. 3C and 3D can be reversed.

Kinking and breaking of wires at a fold may occur if the fold is too sharp. To prevent such kinking, the fold can be performed aroung a wire inserted into the fold area as shown in FIG. 4. After the folded joint is glued to hold it together, the wire can be withdrawn. This technique provides a known minimum radius to the fold and prevents kinking in the fold area.

Other modifications to the specific process described above may occur to a person of skill in this field. For example, it has been found that the fabrication process is improved if commercially available adhesion promoters are applied to the surface of the substrate before the application of a flexible polymer. Preferably, the adhesion promotor is an aluminum chelate, used in conjunction with polymide as the polymer.

Thus, while the invention has been described with reference to a specific embodiment, the description is merely illustrative of the invention and is not to be construed as limiting the invention. Various applications and modifications will occur to those skilled in the art without departing from the true spirit and scope of the invention as defined by the appended claims.

What is claimed is:

1. A method of forming a flexible array of circuit elements and electrical contacts interconnected by continuous wires, comprising the steps of
   (a) providing a body of semiconductor material having opposed major surfaces,
   (b) forming a plurality of said circuit elements on first major surface of said body,
   (c) providing conductive interconnections on said first major surface to interconnect said circuit elements, said conductive interconnections forming two or more substantially parallel, substantially linear regions, such regions connected at their ends by shorter regions substantially perpendicular to said parallel regions in such a manner as to form a continuous meandering path, (d) attaching a flexible polymer layer to said conductive interconnections and said first major surface, (e) providing an opening or openings in said polymer layer to allow contact to said conductive interconnections, (f) removing portions of said body of semiconductor material by etching, leaving separated islands of semiconductor material supported by said polymer layer, (g) attaching an additional polymer layer over the second major surface of said islands and polymer, forming a resulting layer of polymer which encases said islands (h) cutting said resulting polymer layer between and substantially parallel to said parallel regions, but not through said perpendicular regions, (i) folding the said resulting polymer layer through an angle of approximately 180° about an axis perpendicular to said parallel regions, where such fold point is at or near the juncture of said perpendicular region with one of said parallel regions, and then (j) folding the said resulting polymer layer through an angle of approximately 180° about an axis parallel to said parallel regions, where such fold point is at or near the juncture of said perpendicular region with the other adjacent parallel region, and (k) fastening said resulting shape to make it retain its folded shape.

2. A method as claimed in claim 1 wherein said array forms a substantially linear shape after fabrication.

3. A method as claimed in claim 1 wherein said array is an array of silicon diodes connected by metal wires.

4. A method as claimed in claim 1 where steps (i) and (j) are reversed in order.

5. A method as claimed in claim 1 wherein more than two folds are used to provide substantially the same resulting shape wherein the adjacent, formerly parallel regions become substantially co-linear.

6. The method of claim 1 including the further step of preventing tearing at or near folded regions of said resulting polymer layer by forming a substantially circular hole in said resulting polymer layer before said resulting polymer layer is folded, which hole intersects the end of a linear cut also formed in said resulting polymer layer before the folding operation.

7. The method of claim 1 including the further step of preventing kinks and breaks in folded regions of said resulting polymer layer by inserting a wire or other body used as a mandril into the interior angle of the fold during the folding process, with the effect that the radius of the fold is, at a minimum, equal to the radius of the mandril.

8. A method as claimed in claim 7 wherein said mandril is removed after the folding process.

9. A method as claimed in claim 7 wherein said mandril remains as part of the finished array structure.

10. A method as claimed in claim 1 wherein adhesion promoters are applied to surfaces before the application of said flexible polymer to that surface.

11. A method as claimed in claim 10 wherein said adhesion promoter is an aluminum chelate, used in conjunction with polyimide as the said flexible polymer.

12. A method as in claim 7 where steps (i) and (j) are reversed in order.

13. A method as in claim 7 wherein more than two folds are used to provide substantially the same resulting shape wherein the adjacent, formerly parallel regions become substantially co-linear.

14. A method as in claim 12 wherein said array forms a substantially linear shape after fabrication.

15. A method as in claim 13 wherein said array is an array of silicon diodes connected by metal wires.

* * * * *